(12) United States Patent
Trgovich et al.

(10) Patent No.: US 11,755,440 B2
(45) Date of Patent: Sep. 12, 2023

(54) USER INTERFACE AND METHOD TO CONFIGURE SOURCING AND MEASUREMENT TIMING

(71) Applicant: Keithley Instruments, LLC, Solon, OH (US)

(72) Inventors: Jeffrey J. Trgovich, Macedonia, OH (US); James H. Hitchcock, San Angelo, TX (US)

(73) Assignee: Keithley Instruments, LLC, Solon, OH (US)

( * ) Notice: Subject to any disclaimer, the term of this patent is extended or adjusted under 35 U.S.C. 154(b) by 0 days.

(21) Appl. No.: 17/721,158

(22) Filed: Apr. 14, 2022

(65) Prior Publication Data

US 2022/0334938 A1    Oct. 20, 2022

Related U.S. Application Data

(60) Provisional application No. 63/176,003, filed on Apr. 16, 2021.

(51) Int. Cl.
  *G06F 11/263* (2006.01)
  *G06F 11/24* (2006.01)
  *G06F 11/22* (2006.01)
  *G06F 3/04847* (2022.01)

(52) U.S. Cl.
  CPC ........ *G06F 11/263* (2013.01); *G06F 11/2268* (2013.01); *G06F 11/24* (2013.01); *G06F 3/04847* (2013.01)

(58) Field of Classification Search
  CPC .... G06F 11/263; G06F 11/2268; G06F 11/24; G06F 3/04847

USPC ........................................................... 714/46
See application file for complete search history.

(56) References Cited

U.S. PATENT DOCUMENTS

2014/0224867 A1\* 8/2014 Werner ................. G06F 16/235
                                                      235/375

OTHER PUBLICATIONS

Wikipedia "Osciloscope" page, from date Apr. 13, 2021, retrieved from https://web.archive.org/web/20210413063821/https://en.wikipedia.org/wiki/Oscilloscope. (Year: 2021).\*

\* cited by examiner

*Primary Examiner* — Yair Leibovich
(74) *Attorney, Agent, or Firm* — Miller Nash LLP; Andrew J. Harrington

(57) ABSTRACT

A configuration device in a test and measurement system including an event generator and a Device Under Test (DUT) to receive one or more events generated by the event generator includes an output display structured to graphically illustrate a first event timeline that includes source event markers for a first test channel for a second test channel, in which the first event timeline and the second event timeline appear on the output display as separate timelines vertically separated from one another. The position of the event delay indicator or a position of the event width indicator may be movable by a user, and moving the position of the event delay indicator or moving the position of the event width indicator causes the event generator to change one or more event generation parameters of the first event based on such movement. Methods are also disclosed.

23 Claims, 6 Drawing Sheets

USER INTERFACE AND METHOD TO CONFIGURE SOURCING AND MEASUREMENT TIMING

CROSS-REFERENCE TO RELATED APPLICATIONS

This disclosure is a non-provisional of and claims benefit from U.S. Provisional Patent Application No. 63/176,003, titled "USER INTERFACE AND METHOD TO CONFIGURE SOURCING AND MEASUREMENT TIMING," filed Apr. 16, 2021, the disclosure of which is incorporated herein by reference in its entirety.

TECHNICAL FIELD

This disclosure relates to test and measurement systems, and more particularly to a user interface for displaying and configuring operation of one or more test and measurement instruments in a test and measurement system.

BACKGROUND

Devices used in test-and-measurement systems generally include at least a device being tested, often called a Device Under Test (DUT), as well as a measurement instrument, which may include, among others, an oscilloscope, logic analyzer, digital multimeter, spectrum analyzer, or Source Measure Unit (SMU), etc. Other components of a measurement system may include a pulse generator or arbitrary waveform generator structured to generate a signal for controlling or provoking a response in the DUT. For example a pulse generator may be configured to send one or more triggering pulses to the DUT, and then a separate measurement instrument analyzes signals generated by the DUT in response to the triggering pulses. In some cases the measurement instrument itself may include an ability to generate and send the trigger pulse signals, or other signals, to the DUT.

DUTs may include multiple input and/or output channels. Source events, such as a pulse or other signal may be configured by the generating device or a device coupled to the generating device to be sent to one or more input channels on the DUT. Pulses or signals may be configured to be sent to multiple channels simultaneously, but it is frequently desirable to configure particular source events for each DUT input channel independently. Configuring a source event involves setting up the event with details specific to the event. For example, if the source event is sending a triggering pulse to the DUT, then details about the triggering pulse may be typed into a text box, such as entering numeric values to define a width of a pulse as well as a delay time that controls how long after the beginning of the test period the pulse is initiated. Since the event details for each channel may be configured individually, as a set of numbers, mistakes in setting up the pulses are commonplace. Also, it is sometimes difficult to detect when an error has been made in defining an event.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Embodiments of the disclosure include a user interface and methods for displaying, scheduling, and/or interacting with one or more test and measurement instruments, in particular, for visualizing and defining the timing of events, such as sourcing events, pulsing, measurement, etc., by a test and measurement instrument that impacts the behavior and/or response of a device under test (DUT).

Figure 1:
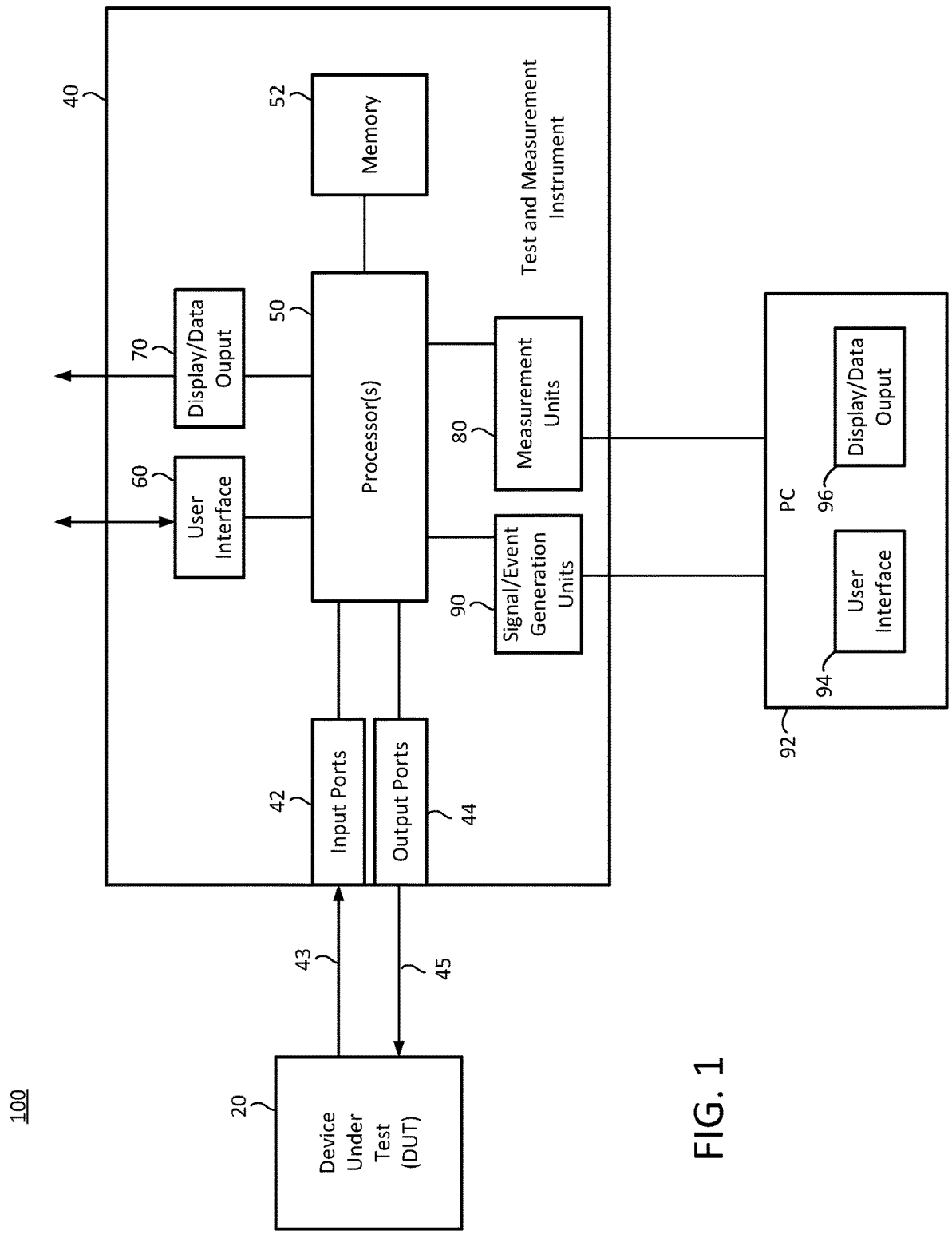
FIG. 1 is a functional block diagram illustrating an example test and measurement system including a user interface for defining one or more source events, according to embodiments of the disclosure.

FIG. 1 is a functional block diagram illustrating portions of a configuration of a test-and-measurement system 100 that includes a Device Under Test (DUT) 20 and a test and measurement instrument 40. The DUT 20 is coupled to the instrument 40 through input ports 42 and output ports 44. The input ports 42 receive test signals from the DUT through a communication path 43, which may be a wired or wireless connection. Similarly, the output ports 44 sends events, which can include signals, such as pulses or other signals, to the DUT 20 through a communication path 45, which also may be wired or wireless. The measurement instrument 40 may be a combined instrument that generates events to be sent to the DUT 20 and also receives signals from the DUT for testing and measuring. Examples of these types of instruments include oscilloscopes, Source Measure Units (SMUs), logic analyzers, spectrum analyzers, or network analyzers, for instance. Or the measurement instrument 40 may be one that generates signals for the DUT, but does not receive signals from the DUT for testing. Examples of these types of instruments include Arbitrary Waveform Generators (AWGs), pulse generators, signal generators, etc. In this latter embodiment, there is typically another instrument, not illustrated, that is used for testing and measuring signals generated by the DUT. Yet other testing systems may use a separate device, such as a Personal Computer (PC) to define source events for a device that actually generates the events and sends them to the DUT. Embodiments of the invention may be embodied in any of the components described above, among others.

As described above, the input ports 42 act as a testing interface to accept signals from the DUT 20 for measuring and testing. The input ports 42 may be any electrical or optical signaling medium. The input ports 42 may be separated by channels, where each channel is structured to receive a separate signal for measuring or testing, and where the instrument 40 is structured to manage each channel independently, or combine channels as directed by the user. There may be any number of separate channels received by the DUT through the input ports 42. Similarly, the output ports 44 send events, such as timing signals, trigger signals, control signals, power signals, codes, information, on/off events, or other signals to the DUT 20. The output ports 44 may also be separated by channels, where each channel is structured to send a separate event to the DUT 20 for various uses. Again, there may be any number of channels on the output ports 44. The instrument 40 is structured to manage each channel of the output ports 44 independently. In some embodiments the user may configure the instrument 40 to send the same output signal or event on multiple channels of the output ports 44 simultaneously. In other embodiments, the output signals or events for each channel of the output ports 44 is configured individually.

The instrument 40 includes one or more processors 50. Although only one processor 50 is shown in FIG. 1 for ease of illustration, as will be understood by one skilled in the art, multiple processors of varying types may be used in combination, rather than a single processor 50. The one or more processors 50 operate in conjunction with memory 52, which may store instructions for controlling the one or more processors, or data related to the measurement of the test signal, data related to signals or events generated by the instrument 40, or general operation of the instrument 40, or other data. The memory 52 may be implemented as processor cache, random access memory (RAM), read only memory (ROM), solid state memory, hard disk drive(s), or any other memory type. Although the memory 52 is illustrated as a single block of memory, memory may be distributed in multiple areas of the processor 40 depending on the implementation details.

A user interface 60 for receiving input from the user is coupled to or integrated into the instrument 40. The user interface 60 may include a keyboard, mouse, pushbuttons, selector knobs, a touchscreen, and/or any other controls employable by a user to interact with the instrument 40. The user interface 60 may include multiple menus and various screens to present and receive information from the user in setting up and operating the instrument 40. The user interface 60 may accept input in text or graphic form, either at the instrument 40 itself, or from a remote device that is separate from the instrument 40.

An output 70 generates measurement display data and other data for the user. The output 70 may be a digital screen, computer monitor, or any other visual device to display test results or other results to a user as discussed herein. The output 70 may also include one or more data outputs that may or may not be correlated with a visual display. The data outputs may include collections of stored data, stored waveforms, or results of analysis performed on measurements. The output 70 could be sent out of the instrument 40 to a network, such as a local area network, the internet, or a cloud of connected computers which may be coupled to a host computer for viewing output or receiving the data.

If the instrument 40 is a measuring instrument, it may generally include one or more measurement units 80. The measurement units 80 include any component capable of measuring aspects (e.g., voltage, amperage, power, etc.) of one or more signals received via the input ports 42. Output from the measurement units 80 may be stored in the memory 52 and also sent to the outputs as visual representations of the measurements or collections of data.

If the instrument 40 generates events to provide to the DUT 20 through the output ports 44, then the instrument 40 may include one or more signal/event generation units 90. The signal/event generation units 90 may generate events or signals such as timing signals, trigger signals, control signals, power signals, codes, information, on/off events, or other signals that cause the DUT 20 to generate a response. Other events or signals generated by the signal generation units 90 may include clock signals, standard and custom waveforms, which may be analog or digital in form, link training signals, radio signals, and protocol signals, for example. Signal parameters may be configured through the user interface 60, and may be selected from a menu of pre-stored examples.

In some embodiments an external Personal Computer (PC) 92 may be coupled to the instrument 40, to control operations or receive measurement data from the DUT 20 or the instrument 40. The PC 92 may include a user interface that operates the same or similar to the user interface 60 described above, and may also include a display/data output 96 that operates the same or similar to the output 70 described above.

The instrument 40 may also include additional hardware and/or processors, such as conditioning circuits, an analog to digital converter, and/or other circuitry to convert a received signal to a waveform for processing as generally used to process an input received from the DUT 20. While particular components of the instrument 40 are depicted in FIG. 1, many additional components may be present in the instrument depending on the type and quality of signal being tested from the DUT 20. Similarly, functions depicted by the separate functional blocks illustrated in FIG. 1 may be combined into a single component, for example, the user interface 60 may include both input and output facilities.

Figure 2:
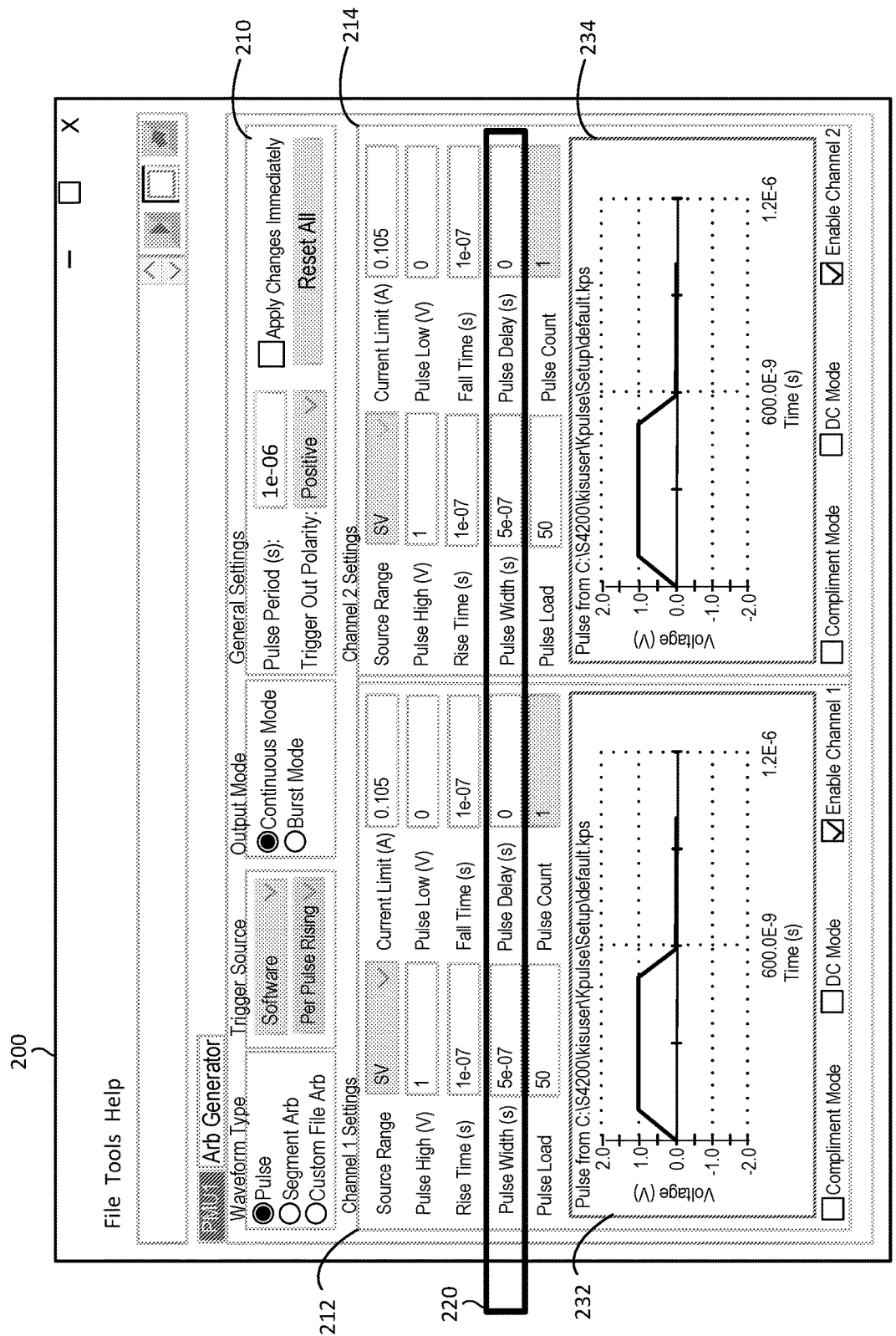
FIG. 2 is a conventional event definition screen for defining a testing pulse.

FIG. 2 illustrates a setup menu that includes a conventional event definition screen 200. In the illustrated embodiment, the event definition screen 200 is one for defining pulses to be sent to the DUT. The screen 200 is presented to a user of an instrument to configure one or more pulses to be sent to a DUT. The screen 200 includes a section 210 for general settings, which is presented in approximately the top third of the screen, as well as separate menu settings 212, 214, respectively, for Channel 1 and Channel 2 in the remaining portion of the screen. If pulses are defined for additional channels, another event definition screen 200 is presented, with settings for the additional channels. As illustrated in FIG. 2, parameters for each pulse in Channel 1 and Channel 2 are configurable by entering numerical parameters in their respective menu portions 212, 214. In operation, the signal-generating instrument uses the entered parameters to generate the events, in this case, pulses, for each channel. In the Example of FIG. 2, pulses for both Channel 1 and Channel 2 are configured identically. Area 220 of the screen 200 illustrates text boxes for receiving parameters for a pulse width and a pulse delay from the user. The pulse width parameter is the time period for which the pulse remains at its maximum value. The pulse delay parameter defines how long to wait after the beginning of the test period to initiate the pulse. For repeating test periods, this cycle of waiting for the pulse delay time period, then generating the pulse as defined by the parameters, repeats until the test concludes. Graphic areas 232 and 234 produce a visual display of pulses defined in the menu settings 212, 214 for Channel 1 and Channel 2, respectively. Although the graphic areas 232, 234, produce useful information, each graphic area is limited to showing the output for a single channel. Further, entering numerical values for the pulse width and pulse delay parameters in area 220 of the screen 200 is prone to the user error.

Figure 3:
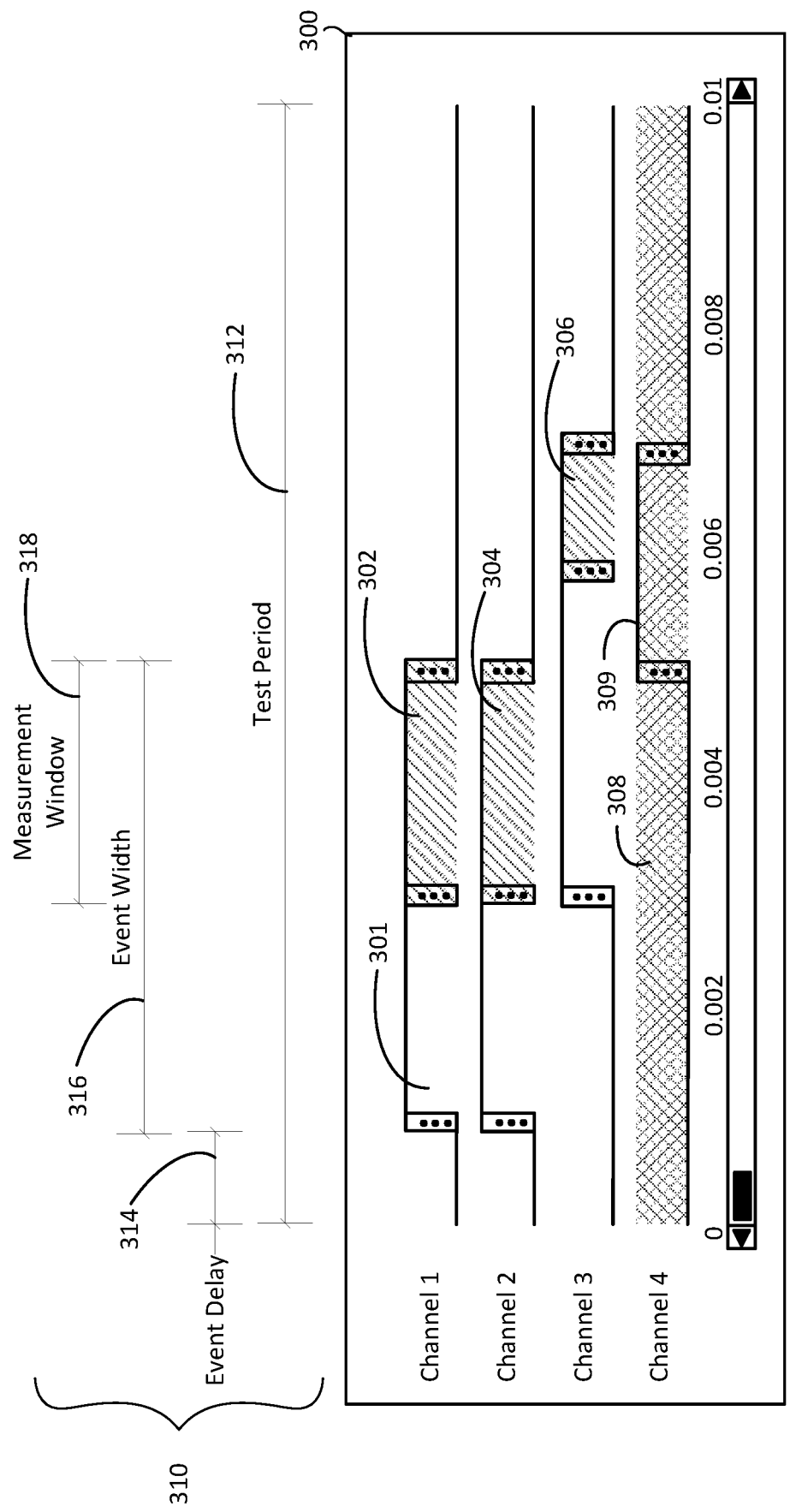
FIG. 3 is an illustration including a signal visualization screen for displaying event information to a user according to embodiments of the disclosure.

FIG. 3 illustrates an example visualization screen 300 that presents event information as markers for multiple channels simultaneously according to embodiments of the disclosure. The visualization screen 300 may be presented on the output 70 of instrument 40 of FIG. 1, for example, or may be presented on the output 96 of the connected PC 92. The visualization screen 300 provides a new method of displaying event configuration information through event markers that allows the user to easily compare sourcing events for multiple channels relative to one another. This is much different than the graphic areas 232, 234 of FIG. 2, which instead only illustrate an event, such as a defined pulse, for a single channel.

As illustrated in FIG. 3, source information and measurement information for four channels are shown, Channel 1, Channel 2, Channel 3, and Channel 4. Event parameter information 310 includes information conveyed by the visualization screen about the event on Channel 1, but the text and symbols shown in the parameter information 310 of FIG. 3 is not normally shown to the user. Rather, the parameter information 310 describes information that is graphically illustrated to the user in the visualization screen 300, and does not need to be separately conveyed. A test period 312 indicates the duration of a single testing period. This test period 312 duration may be set numerically by a user through a text-based input screen of the user interface 60 of FIG. 1. For continuous-mode testing, the test period 312 repeats every testing cycle until the testing ends. In the example illustrated in FIG. 3, the test period 312 is 0.01 seconds in duration, which applies to all of the illustrated Channels 1-4. An event delay 314 illustrates the time delay, measured from the start of the event period, until the event on Channel 1 begins. An event width 316 indicates the duration of the event on Channel 1. That is, the event begins immediately at the conclusion of the event delay 314, and the event ends immediately at the time illustrated by the event width 316. Visualizing the event delay 314, event width 316, and test period 312 of multiple events, through event markers that are oriented vertically, or stacked, on top of one another, provides the user with intuitive visual feedback of the relative size, duration, and offset of one event to another. As described above, source events configured to be sent to the DUT and represented on the visualization screen 300 may include any type of event, such as timing signals, trigger signals, control signals, power signals, codes, information, on/off events, or other signals. Also, although only four channels are illustrated in FIG. 3, for ease of illustration, any number of source or measurement channels may be illustrated on the visualization screen 300 in the manner as described above.

Information about measurement channels from the DUT, as opposed to source events on source channels for the DUT, may also be indicated by event markers on the visualization screen 300. Measurement windows 302, 304, 306, and 308 indicated by the different patterns indicate measurement periods of the measurement channels 1-4 during the pulse period 312 superimposed on the visualizations for the source channels during the same period. For example, the event illustrated for Channel 1 has portions illustrated, portion 301 and portion 302 of the event marker. The portion 302 of the marker illustrates the measurement window, while the portion 301 of the marker is outside, or before, the measurement window 302. Sometimes a trigger or startup event signal provided to a DUT causes the DUT to immediately react with a large amount of startup noise, or other artifacts caused by receiving the event. Controlling a measurement window 318 that can have a duration other than the entire event width 316 allows the user to specify an exclusion period during the event that is not measured, i.e., ignored by the measurement device. Then, after a startup period of the DUT, i.e., after the startup noise period has passed, the measurement takes place in the measurement channel. As illustrated in FIG. 3, the source events for Channel 1 may be visualized along with measurement events that are related to that channel. Similar measurement windows for Channel 2 and Channel 3 are illustrated as 304 and 306, respectively. The measurement window for Channel 4 is different than the others, as the measurement window 308 extends during the entire duration of the pulse period 312 for Channel 4. Note how the measurement window 308 extends beyond the width of an event 309 illustrated in Channel 4. This visualization for Channel 4 indicates to the user that Channel 4 of the DUT is being measured at all times, and the event 309 is sent to the DUT once every test period 312. With this signal generation and testing setup as illustrated in FIG. 3, the DUT response on Channel 4 is monitored for the entire testing period, and the complete response to the event 309 made by the DUT can be captured by the measuring instrument. In other words, unlike for Channel 1, Channel 2, and Channel 3, which all have a period of the event in which the response of the DUT is ignored, for Channel 4, the entire response of the DUT is observed and measured. And all of this configuration information of the measurement instrument is precisely and intuitively provided to the user through event markers in the illustrated visualization 300. Of course other visualizations or markers are possible in other embodiments of the invention, and are not limited only to the visualization 300 and markers illustrated in FIG. 3.

Another difference between the event markers for Channel 4 compared to markers for the other three channels is that the appearance of the measurement window 308 for Channel 4 differs from the appearance of the pulse portions 302, 304, 306 for Channel 1, Channel 2, and Channel 3. Two forms of measurements are illustrated in the visualization screen 300 of FIG. 3. For Channels 1-3, the visualization indicates that the measurement samples for each individual channel from the DUT are to be averaged, while, for Channel 4, all measurement samples are recorded and available for analysis. Note again that the different form of measurement types is efficiently conveyed to the user by using different appearances in the visualization to indicate different channel operation.

The timeline-styled view of the visualization screen 300, where each channel is individually illustrated with markers referenced to the same pulse period, provides instant visual information to the viewer about the signals sent to the DUT and measurement periods during which the DUT is evaluated. Note, too, that the beginning of each of the channel timelines illustrated in the visualization 300 is referenced to the same point in time for all of the timelines, i.e., the beginning of the test period 312. This stacked-channel visualization method using event markers illustrated in FIG. 3 provides the user of the measurement device with intuitive visual feedback of the relative size, duration, delay, and offset of operations of the individual channel signals to one another, and additionally provides information about the various measurement types and durations for each channel of the DUT. Further, the same or similar visualizations may be used no matter if the test period 312 is a single test period, or if the test period 312 repeats multiple times during the testing of the DUT.

Figure 4A:
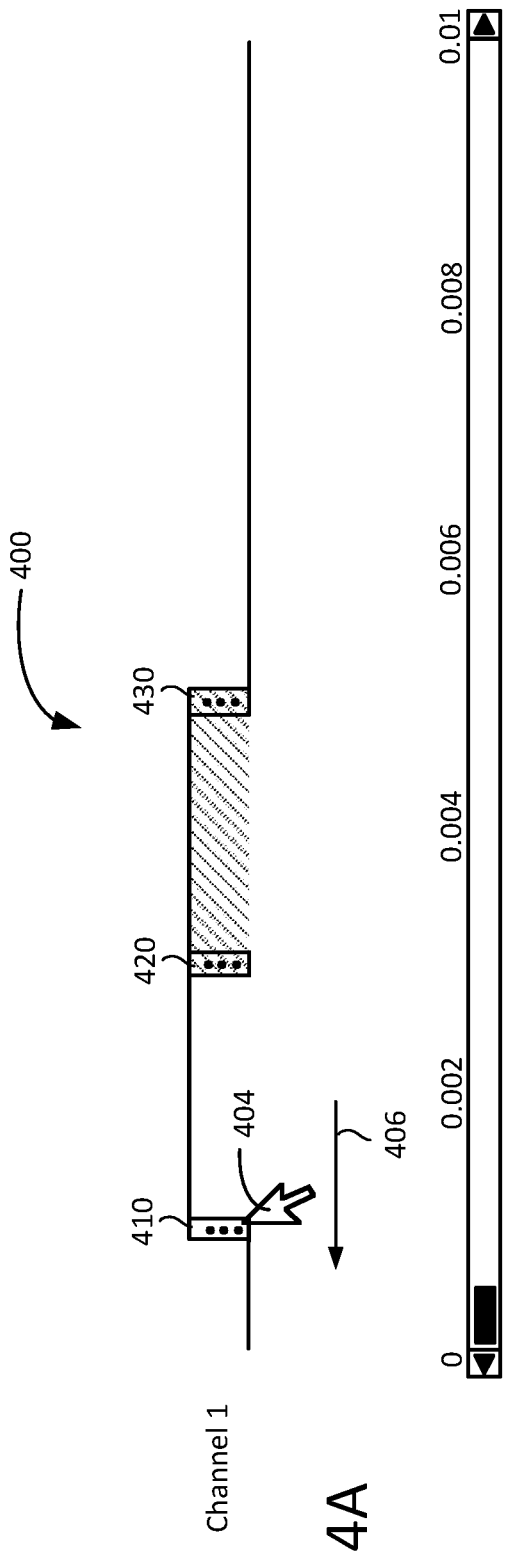
FIGS. 4A and 4B illustrate a first mode for configuring signal parameters according to embodiments of the disclosure.
Figure 4B:
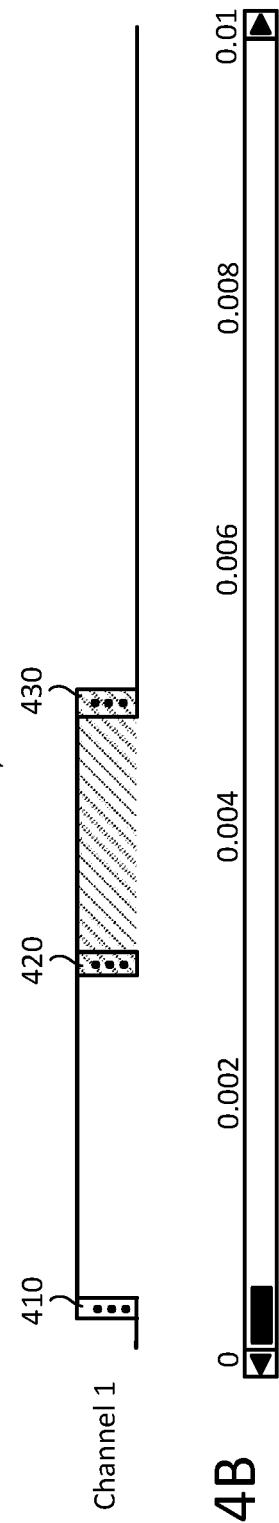

FIGS. 4A and 4B illustrates how, in addition to visualizing source event and measurement qualities of a measurement device, embodiments of the invention provide a user with an ability to modify qualities of the events generated for testing without any need for manual entry of the event specifications. FIG. 4A illustrates an event 400, such as a triggering pulse, that is being configured to be sent on Channel 1 of a DUT. As described with reference to FIG. 3, an event delay, event width, and measurement period are all graphically indicated in FIG. 4A by the shape and markings of the event 400. In embodiments of the invention, the depiction of the event 400 is interactive. That is, parameters of the event 400 may be manipulated by a user, as described below. Although only one event, i.e., an event for Channel 1, is illustrated in FIGS. 4A and 4B for clarity, generally any number of events for any of the selected channels may be illustrated at the same time on the same display, so that the user may modify the parameters of any of the events while viewing all of the events for the various channels.

Event 400 of FIG. 4 includes three interactive indicators, or bars. Specifically, an event delay bar 410 indicates how much delay the event 400 incurs after the beginning of the test period. A measurement bar 420 indicates when a measurement period of the channel begins, and an event width bar 430 indicates the end of the event 400 and the end of the measurement period for Channel 1. Each of the bars 410, 420, 430 is movable by a user first selecting the desired bar, and then moving the bar left or right to the desired position along the timeline of the test period. For example, in FIG. 4A, a user navigates a selector 404, which may be controlled by a mouse or touch screen through the user interfaces 60 or 92 of FIG. 1, to select the event delay bar 410. Once selected, the user drags the event delay bar 410 toward the start of the event period, as indicated at 406, and releases the event delay bar when it is at the desired position. Moving the event delay bar 410 to the left minimizes the delay of the event 400 after the beginning of the test period. In other words, moving the event delay bar 410 closer to the beginning of the test period means there will be a shorter delay from the beginning of the test period until the event 400 is initiated. Any of the bars 410, 420, or 430 may be individually moved to modify not only the visualization, but also to modify the actual configuration parameters of the event 400 that an instrument uses to generate the event 400. The bars 410, 420, and 430 may snap to particular locations or may otherwise be controlled to assist the user in setting event or measurement parameters.

In some embodiments, while the user is dragging, the bars 410, 420, or 430 may snap to particular points in time that may be useful or interesting for the user. For example, a bar on one channel timeline may snap to a point that aligns with the start or end of another event on another channel's timeline, or to a point that aligns with the start or end of a measurement region on the same or another channel timeline. In some embodiments, the events or measurement periods from different channels may be linked or grouped together. For example, the event from one channel, e.g. Channel 3, may have a fixed delay, positive or negative in time, with respect to an event on another channel, e.g., Channel 1. Then, when the user changes the timing of the primary event, for example, by dragging one of the bars 420, 420, or 430 for Channel 1, the timing of any other linked events on other channels is also automatically adjusted accordingly, to maintain the same fixed delay of Channel 3 with respect to Channel 1.

Returning back to FIG. 4B, after moving the event delay bar 410 towards the beginning of the test period, the event 400 has an appearance as illustrated in FIG. 4B, which has a longer duration, and a shorter delay period. Although not illustrated, the measurement period may also be modified by dragging the measurement bar 420 toward the left or right, which increases or decreases, respectively, the duration of the measurement period. Note that modifying the measurement period does not modify the width or duration of the event 400. Further, dragging the event width bar 430 to the right extends both the event width, and therefore, duration, of the event 400 as well as the measurement period of Channel 1. In some embodiments, the end point of the measurement period and the end point of the event may have separate interactive bars, where each parameter may be changed separately from the other. By moving the indicator bars 410, 420, 430 left or right, the user may set or modify the event delay, event duration, measurement duration, and relative position of the measurement period to the position of the event 400. Then, after the event and measurement parameters are set, a measurement instrument, such as the instrument 40 of FIG. 1, uses the defined parameters to generate events, such as the pulses, codes, commands, or various signals for sending to the DUT for testing, as well as informing the instrument the timing parameters of the measurement period.

Figure 5:
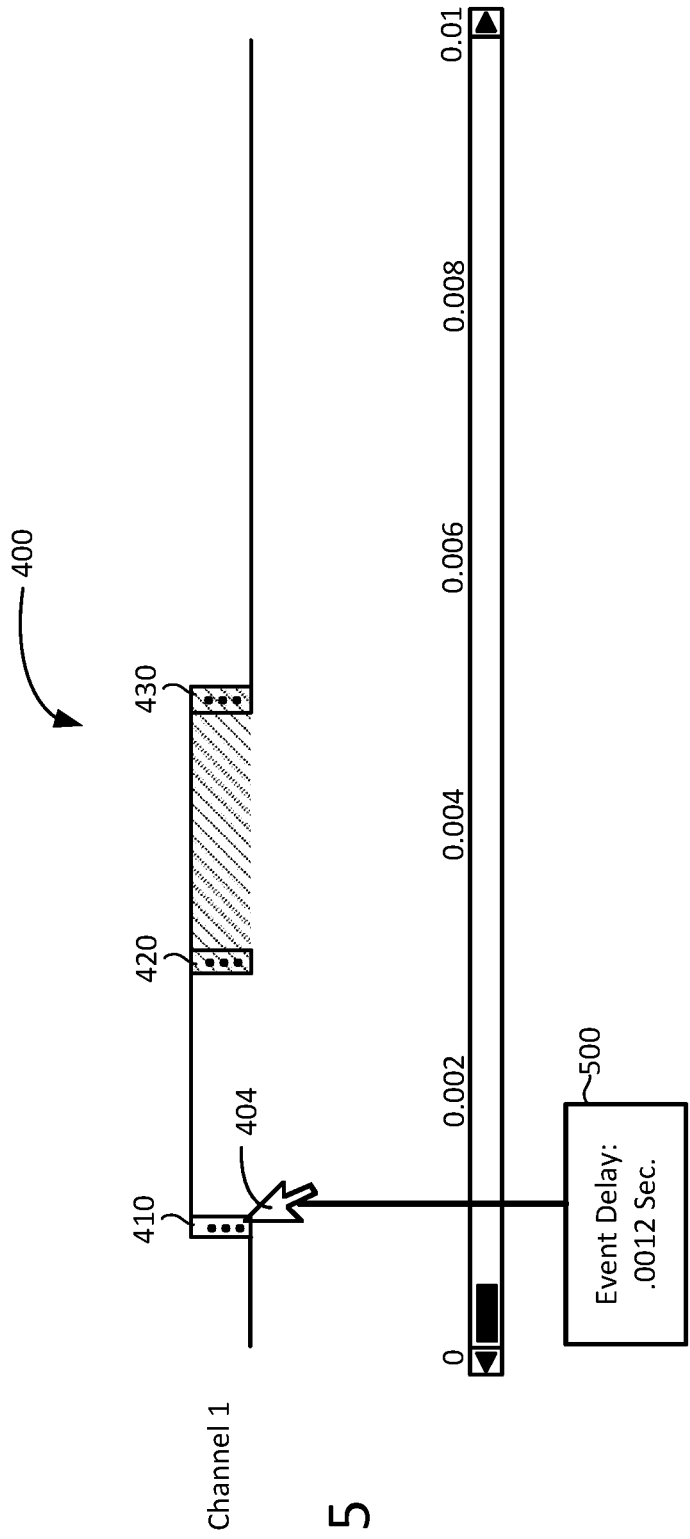
FIG. 5 illustrate another mode for configuring event parameters according to embodiments of the disclosure.

FIG. 5 illustrates another method for setting or modifying parameters for the event 400, such as a pulse signal or other event, for sending to a DUT for testing, or for setting the measurement window. The embodiment illustrated in FIG. 5 operates similarly to the embodiment illustrated in FIG. 4A, except that after selecting any of the interactive bars 410, 420, or 430, a text data box appears. In the illustrated embodiment of FIG. 5, the user has used the selector 404 to select the indicator bar 410. Then, when the indicator bar 410 is selected, a text data box 500 appears. Data within the text data box 500 indicates the precise location of the indicator bar 410, presented in data form relative to the beginning of the test period. For example, as illustrated in FIG. 5, when the indicator bar 410 is selected, the text data box 500 indicates that the position of the indicator bar 410 is at 0.0012 seconds from the beginning of the timeline. This indicates an event delay of 0.0012 seconds. Then, as the user drags the indicator bar 410 left or right, the data within the text data box 500 updates automatically based on the position of the indicator bar. When the data within the text data box 500 matches the desired location for the indicator bar 410, the user de-selects the indicator bar 410, and the location is set at the last location indicated by the data within the text data box 500. Such a system allows for precise control of the locations of the indicator bars 410, 420, and 430, and thus gives the user an ability to control the parameters of any of the events or measurement windows for any of the channels illustrated on the graphic display.

Figure 6A:
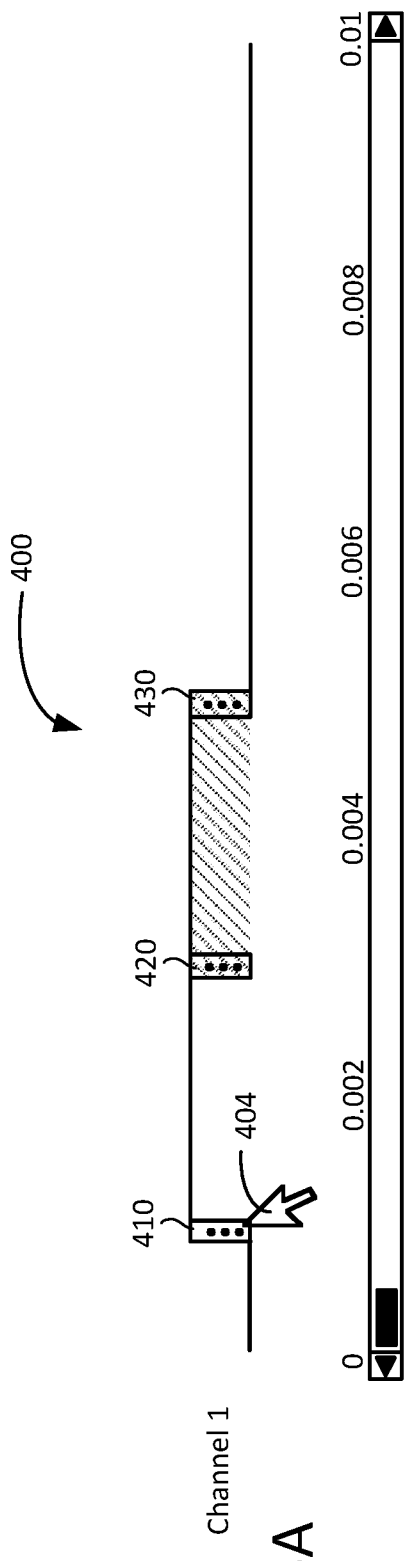
FIGS. 6A and 6B illustrate yet another mode for configuring event parameters according to embodiments of the disclosure.
Figure 6B:
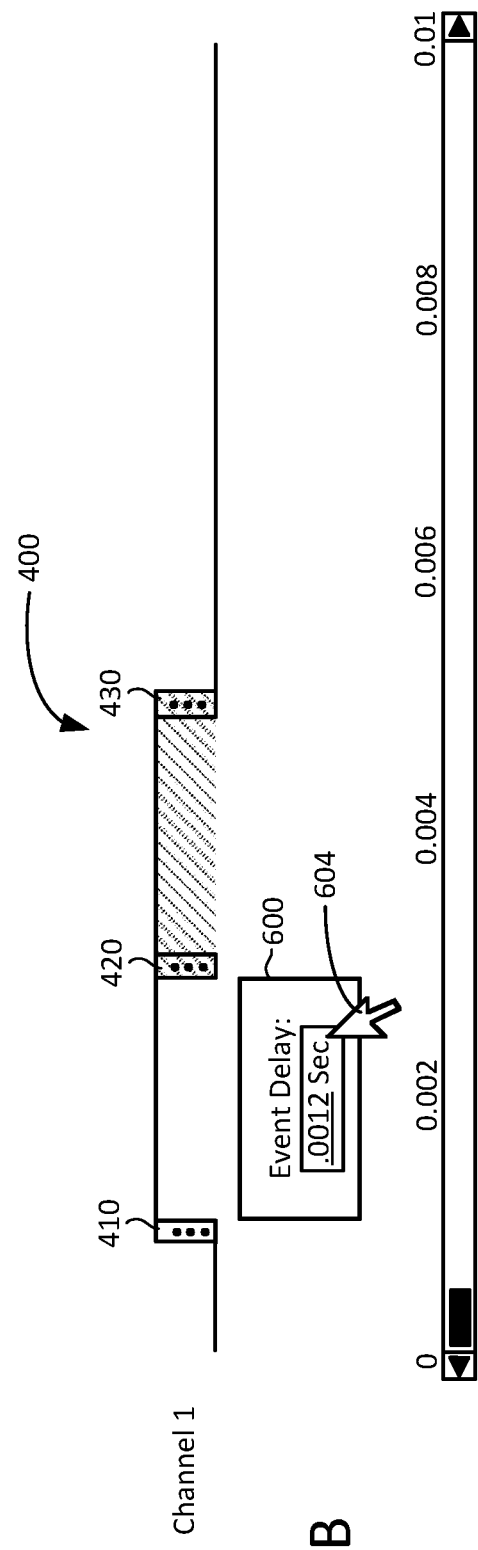

FIGS. 6A and 6B illustrate yet another method for setting or modifying parameters for an event or measurement window. The method illustrated in these figures is similar to, yet different than the embodiments illustrated above. In this embodiment, the user may desire to enter a specific value for any of the indicator bars 410, 420, or 430. The user indicates this by performing a double-click, using, for example, selector 404, on any of the indicator bars. Then, after the double-click, a dialog box 600 automatically appears in a mode waiting for numerical input from the user. A selector 604 may also appear to help the user enter the numerical input. Then, after entering the desired number value, the indicator bar automatically moves to the position set by the user. In other embodiments the user may perform a different action to allow entry of a numeric value in the dialog box 600. For example, the user may right-click, click and hold, long press, perform a gesture, etc., or perform any other action to initiate entry of a value. These actions described above may be performed by a user using a keyboard, mouse, touchscreen, augmented reality interface, or any other user interface device.

In some embodiments, the user interface described above may be used to configure timing and other attributes of events, such as or events or signals generated from an Arbitrary Function Generator (AFG), an Arbitrary Waveform Generator (AWG) or a programmable power supply, for example. In still other embodiments, the test and measurement instrument may not source any signals, yet the user interface described above may still be used to graphically configure analog measurements, digitizer timing, measurement regions, etc.

In some embodiments, the test and measurement system may use the configuration parameters set by a user through the user interface to output test scripts, commands, or other code that may be used to automatically configure other instruments or test modules in the test system. The output may be in a variety of formats including, for example, Small Computer Peripheral Interface (SCPI) commands, languages such as Python, proprietary scripting languages such as Keithley Instruments' Test Script Processor (TSP®) scripts, or other formats.

In some embodiments, the system may generate a human readable event log of the configured test sequence. Such an event log may be used, for example, to debug or review the test.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. An embodiment of the technologies may include any one or more, and any combination of, the examples described below.

Example 1 is a configuration device for a test and measurement system including an event generator and a Device Under Test (DUT) to receive one or more events managed by the event generator, the configuration device including an output display structured to graphically illustrate a first event timeline that includes source event markers for a first test channel and structured to graphically illustrate a second event timeline that includes source event markers for a second test channel, the first event timeline and the second event timeline being vertically separated from one another on the output display, and the first event timeline and the second event timeline beginning at a same common time.

Example 2 is a configuration device according to Example 1, in which the same common time is a beginning of a test period.

Example 3 is a configuration device according to any of the preceding Examples, in which a source event for the first test channel is illustrated on the output display as an event marker on the first timeline, the event marker having an event width that corresponds to a duration of the source event.

Example 4 is a configuration device according to Example 3, in which the output display is further configured to indicate a measurement duration of a first measurement channel of the DUT that is related to the first test channel.

Example 5 is a configuration device according to Example 4, in which the first measurement channel conveys a response signal from the DUT after receiving the source event for the first test channel.

Example 6 is a configuration device according to any of the preceding Examples, in which a first event marker for the first event includes an event delay indicator and an event width indicator.

Example 7 is a configuration device according to Example 4, in which the first event marker for the first event further includes a measurement window indicator.

Example 8 is a configuration device according to Example 6, in which the output display is a graphical user interface structured to receive input from a user, in which a position of the event delay indicator or a position of the event width indicator is movable by a user, and in which moving the position of the event delay indicator or moving the position of the event width indicator causes the event generator to change one or more signal generation parameters of the first event based on such movement.

Example 9 is a configuration device according to Example, in which the output display is a graphical user interface structured to receive input from a user, in which a position of the measurement window indicator is movable by a user, and in which moving the position of the measurement window indicator causes a test device in the test and measurement system to modify a measurement duration parameter of a test signal received by the test device from the DUT.

Example 10 is a configuration device according to Example 6, in which the output display is structured to update a text display of the position of the event delay indicator or a text display of the position of the event width indicator when one of the indicators is moved by the user.

Example 11 is a configuration device according to Example 6, in which, in which the output display is a user interface structured to generate a text-based dialog box when a user selects either the event delay indicator or the event width indicator.

Example 12 is a configuration device according to any of the preceding Examples, in which the one or more events is a timing signal, trigger signal, control signal, power signal, code, information, or an on/off event.

Example 13 is a method in a configuration device for a test and measurement system including an event generator and a Device Under Test (DUT) to receive one or more events generated by the event generator, the method including graphically illustrating on a display device a first event timeline that includes a source event marker representing a first event for a first test channel and a second event timeline representing a second event for a second test channel, in which the first event timeline and the second event timeline appear on the output display vertically separated from one another, and in which the first event timeline and the second event timeline beginning at a same common time.

Example 14 is a method according to Example 13, in which the same common time is a beginning of a test period.

Example 15 is a method according to any preceding Example methods, in which a source event for the first test channel is illustrated on the output display as an event marker on the first timeline, the event marker having an event width that corresponds to a duration of the source event.

Example 16 is a method according to Example 15, further comprising graphically indicating a measurement duration of a first measurement channel of the DUT that is related to the first test channel.

Example 17 is a method according to any preceding Example methods, in which the first event marker for the first event includes an event delay indicator and an event width indicator.

Example 18 is a method according to Example 16, in which the first event marker for the first event further includes a measurement window indicator.

Example 19 is a method according to Example 17, in which the output display is a graphical user interface structured to receive input from a user, in which a position of the event delay indicator or a position of the event width indicator is movable by a user, and in which moving the position of the event delay indicator or moving the position of the event width indicator causes the event generator to change one or more signal generation parameters of the first event based on such movement.

Example 20 is a method according to Example 18, in which the output display is a graphical user interface structured to receive input from a user, in which a position of the measurement window indicator is movable by a user, and in which moving the position of the measurement window indicator causes a test device in the test and measurement system to modify a measurement duration parameter of a test signal received by the test device from the DUT.

Example 21 is a method according to Example 17, in which the output display is structured to update a text display of the position of the event delay indicator or a text display of the position of the event width indicator when one of the indicators is moved by the user.

Example 22 is a method according to Example 17, in which the output display is a user interface structured to generate a text-based dialog box when a user selects either the event delay indicator or the event width indicator.

Example 23 is a method according to any of the preceding Example methods, in which the one or more events is a timing signal, trigger signal, control signal, power signal, code, information, or an on/off event.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A configuration device for a test and measurement system including an event generator and a Device Under Test (DUT) to receive one or more events managed by the event generator, the configuration device comprising:
an output display of the event generator structured to graphically illustrate a first event timeline of a first event that includes source event markers for a first test channel and structured to graphically illustrate a second event timeline of a second event that includes source event markers for a second test channel, the first event timeline and the second event timeline being vertically separated from one another on the output display, and the first event timeline and the second event timeline beginning at a same common time.

2. The configuration device according to claim 1, in which the same common time is a beginning of a test period.

3. The configuration device according to claim 1, in which a source event for the first test channel is illustrated on the output display as an event marker on the first event timeline, the event marker having an event width that corresponds to a duration of the source event.

4. The configuration device according to claim 3, in which the output display is further configured to indicate a measurement duration of a first measurement channel of the DUT that is related to the first test channel.

5. The configuration device according to claim 4, in which the first measurement channel conveys a response signal from the DUT after receiving the source event for the first test channel.

6. The configuration device according to claim 1, in which a first event marker for the first event includes an event delay indicator and an event width indicator.

7. The configuration device according to claim 6, in which the first event marker for the first event further includes a measurement window indicator.

8. The configuration device according to claim 7, in which the output display is a graphical user interface structured to receive input from a user, in which a position of the measurement window indicator is movable by the user, and in which moving the position of the measurement window indicator causes a test device in the test and measurement system to modify a measurement duration parameter of a test signal received by the test device from the DUT.

9. The configuration device according to claim 6, in which the output display is a graphical user interface structured to receive input from a user, in which a position of the event delay indicator or a position of the event width indicator is movable by the user, and in which moving the position of the event delay indicator or moving the position of the event width indicator causes the event generator to change one or more signal generation parameters of the first event based on such movement.

10. The configuration device according to claim 9, in which the output display is structured to update a text display of the position of the event delay indicator or a text display of the position of the event width indicator when one of the indicators is moved by the user.

11. The configuration device according to claim 6, in which the output display is a user interface structured to generate a text-based dialog box when a user selects either the event delay indicator or the event width indicator.

12. The configuration device according to claim 1, in which the one or more events is a timing signal, trigger signal, control signal, power signal, code, information, or an on/off event.

13. A method in a configuration device for a test and measurement system including an event generator and a Device Under Test (DUT) to receive one or more events generated by the event generator, the method comprising:
graphically illustrating on a display device of the event generator a first event timeline that includes a first event marker representing a first event for a first test channel and a second event timeline that includes a second event marker representing a second event for a second test channel, in which the first event timeline and the second event timeline appear on the display device vertically separated from one another, and in which the first event timeline and the second event timeline beginning at a same common time.

14. The method according to claim 13, in which the same common time is a beginning of a test period.

15. The method according to claim 13, in which the first event for the first test channel is illustrated on the display device as the first event marker on the first event timeline, the first event marker having an event width that corresponds to a duration of the first event.

16. The method according to claim 15, further comprising graphically indicating a measurement duration of a first measurement channel of the DUT that is related to the first test channel.

17. The method according to claim 16, in which the first event marker for the first event further includes a measurement window indicator.

18. The method according to claim 17, in which the display device is a graphical user interface structured to receive input from a user, in which a position of the measurement window indicator is movable by the user, and in which moving the position of the measurement window indicator causes a test device in the test and measurement system to modify a measurement duration parameter of a test signal received by the test device from the DUT.

19. The method according to claim 13, in which the first event marker for the first event includes an event delay indicator and an event width indicator.

20. The method according to claim 19, in which the display device is a graphical user interface structured to receive input from a user, in which a position of the event delay indicator or a position of the event width indicator is movable by the user, and in which moving the position of the event delay indicator or moving the position of the event width indicator causes the event generator to change one or more signal generation parameters of the first event based on such movement.

21. The method according to claim 20, in which the display device is structured to update a text display of the position of the event delay indicator or a text display of the position of the event width indicator when one of the indicators is moved by the user.

22. The method according to claim 19, in which the display device is a user interface structured to generate a text-based dialog box when a user selects either the event delay indicator or the event width indicator.

23. The method according to claim 13, in which the one or more events is a timing signal, trigger signal, control signal, power signal, code, information, or an on/off event.

* * * * *